(12) United States Patent
Murakami et al.

(10) Patent No.: US 10,484,087 B2
(45) Date of Patent: Nov. 19, 2019

(54) OPTICAL TRANSMISSION DEVICE

(71) Applicant: FUJI XEROX CO., LTD., Tokyo (JP)

(72) Inventors: Akemi Murakami, Kanagawa (JP);
Junichiro Hayakawa, Kanagawa (JP);
Hideo Nakayama, Kanagawa (JP);
Tsutomu Otsuka, Kanagawa (JP)

(73) Assignee: FUJI XEROX CO., LTD., Minato-ku, Tokyo (JP)

(*) Notice: Subject to any disclaimer, the term of this patent is extended or adjusted under 35 U.S.C. 154(b) by 0 days.

(21) Appl. No.: 15/727,098

(22) Filed: Oct. 6, 2017

(65) Prior Publication Data

US 2018/0138971 A1     May 17, 2018

(30) Foreign Application Priority Data

Nov. 16, 2016    (JP) ................................ 2016-223543

(51) Int. Cl.
*H04B 10/08*     (2006.01)
*H04B 10/07*     (2013.01)
(Continued)

(52) U.S. Cl.
CPC ........... *H04B 10/07* (2013.01); *H01S 5/0021* (2013.01); *H01S 5/0625* (2013.01); *H01S 5/423* (2013.01); *H04B 10/2507* (2013.01); *H04B 10/50* (2013.01); *H04B 10/66* (2013.01); *H04B 10/801* (2013.01); *H04L 7/0075* (2013.01); *H01S 5/026* (2013.01); *H01S 5/0282* (2013.01); *H01S 5/02248* (2013.01); *H01S 5/02276* (2013.01); *H01S 5/02296* (2013.01); *H01S 5/0683* (2013.01); *H01S 5/18311* (2013.01); *H01S 5/34313* (2013.01); *H01S 2301/176* (2013.01); *H01S 2304/04* (2013.01); *H04B 2210/07* (2013.01)

(58) Field of Classification Search
CPC .... H04B 10/07; H04B 10/2507; H04B 10/50; H04B 10/66; H04B 10/801; H04B 2210/07; H01S 5/0625; H01S 5/0021; H01S 5/423; H01S 5/02248; H01S 5/02276; H01S 5/02296; H01S 5/026; H01S 5/0282; H01S 5/0683; H01S 5/18311; H01S 5/34313; H01S 2301/176; H01S 2304/04; H04L 7/0075
USPC ................................................... 398/25, 182
See application file for complete search history.

(56) References Cited

U.S. PATENT DOCUMENTS 4,772,799 A * 9/1988 Inui .......................... B62D 1/04
                                                 250/551
2006/0245753 A1* 11/2006 Hurt ..................... H04B 10/032
                                                 398/25
(Continued)

FOREIGN PATENT DOCUMENTS

JP       2002-368694 A     12/2002

*Primary Examiner* — Mohammad R Sedighian
(74) *Attorney, Agent, or Firm* — Sughrue Mion, PLLC

(57) ABSTRACT

An optical transmission device includes a first light emitting element, a second light emitting element, and a detection unit. The first light emitting element is configured to emit light. The second light emitting element is configured to emit light. The second light emitting element is connected in parallel with the first light emitting element and is configured to deteriorate earlier than the first light emitting element. The detection unit is configured to detect whether the second light emitting element is deteriorated.

14 Claims, 13 Drawing Sheets

(51) Int. Cl.
*H04B 10/50* (2013.01)
*H04B 10/2507* (2013.01)
*H04B 10/80* (2013.01)
*H04L 7/00* (2006.01)
*H01S 5/0625* (2006.01)
*H04B 10/66* (2013.01)
*H01S 5/00* (2006.01)
*H01S 5/42* (2006.01)
*H01S 5/022* (2006.01)
*H01S 5/026* (2006.01)
*H01S 5/028* (2006.01)
*H01S 5/0683* (2006.01)
*H01S 5/183* (2006.01)
*H01S 5/343* (2006.01)

(56) References Cited

U.S. PATENT DOCUMENTS

| | | | | |
|---|---|---|---|---|
| 2009/0052490 A1* | 2/2009 | Maeda | ......... | H01S 5/0217 |
| | | | | 257/E21.002 |
| 2011/0279007 A1* | 11/2011 | Kishimoto | ......... | B60Q 1/0011 |
| | | | | 313/45 |
| 2012/0092875 A1* | 4/2012 | Cho | ......... | F21S 2/005 |
| | | | | 362/311.01 |
| 2012/0235574 A1* | 9/2012 | Sumi | ......... | H05B 33/0887 |
| | | | | 315/131 |
| 2012/0313979 A1* | 12/2012 | Matsuura | ......... | G09G 3/3413 |
| | | | | 345/690 |
| 2013/0121688 A1* | 5/2013 | Sato | ......... | H04B 10/0799 |
| | | | | 398/25 |
| 2014/0292223 A1* | 10/2014 | Hirasawa | ......... | H01L 27/3211 |
| | | | | 315/293 |

* cited by examiner

OPTICAL TRANSMISSION DEVICE

CROSS-REFERENCE TO RELATED APPLICATIONS

This application is based on and claims priority under 35 USC 119 from Japanese Patent Application No. 2016-223543 filed Nov. 16, 2016.

BACKGROUND

Technical Field

The present invention relates to an optical transmission device.

SUMMARY

According to an aspect of the invention, an optical transmission device includes a first light emitting element, a second light emitting element, and a detection unit. The first light emitting element is configured to emit light. The second light emitting element is configured to emit light. The second light emitting element is connected in parallel with the first light emitting element and is configured to deteriorate earlier than the first light emitting element. The detection unit is configured to detect whether the second light emitting element is deteriorated.

BRIEF DESCRIPTION OF THE DRAWINGS

Exemplary embodiments of the present invention will be described in detail based on the following figures, wherein.

DETAILED DESCRIPTION

Hereinafter, exemplary embodiments for carrying out the present invention will be described in detail with reference to the drawings.

[First Exemplary Embodiment]

Figure 1A:
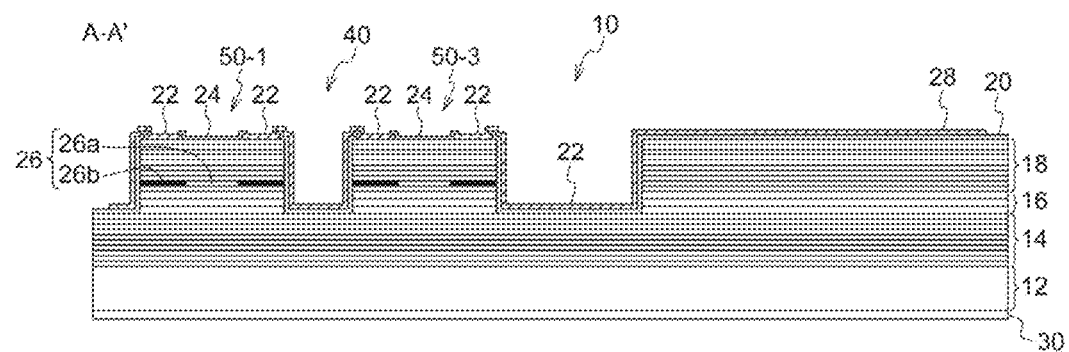
FIG. 1A is a cross-sectional view illustrating an example of the configuration of an optical module according to an exemplary embodiment.
Figure 1B:
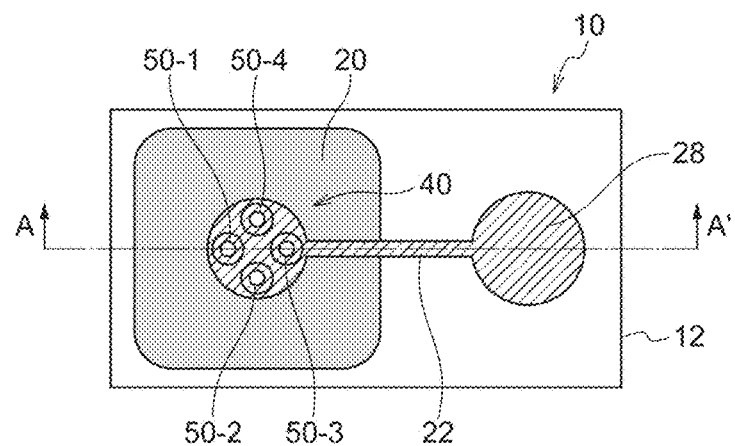
FIG. 1B is a plan view of the optical module.

An example of the configuration of an optical module 10 according to the present exemplary embodiment will be described with reference to FIGS. 1A and 1B. In the present exemplary embodiment, a mode in which a vertical cavity surface emitting laser (VCSEL) array is applied to the optical module according to the exemplary embodiment of the present invention will be described by way of an example. FIG. 1A is a cross-sectional view of the optical module 10 according to the present exemplary embodiment. FIG. 1B is a plan view of the optical module 10. The cross-sectional view illustrated in FIG. 1A is a cross-sectional view taken along the line A-A' in the plan view illustrated in FIG. 1B. There may be a case where the optical module 10 according to the present exemplary embodiment includes a drive unit that drives the VCSEL array. However, FIGS. 1A and 1B illustrate the mode in which the drive unit is not provided. In addition, in the present exemplary embodiment, multiple VCSEL elements which constitute the VCSEL array are mainly used to secure the redundancy of light emission from the optical module 10. That is, the redundancy is secured when the VCSEL array is configured with the multiple VCSEL elements connected in parallel to each other so that each VCSEL element has a rating capable of outputting the amount of light required to perform communication as a single VCSEL element and normal communication may be maintained even when one VCSEL element is damaged due to, for example, a surge voltage from the outside.

As illustrated in FIG. 1A, the optical module 10 is configured as a stacked structure including an n-side electrode wiring 30, an n-type lower distributed Bragg reflector (DBR) 14 formed on an n-type gallium arsenide (GaAs) substrate 12, an active layer area 16, an oxide confinement layer 26, a p-type upper DBR 18, an interlayer insulating film 20, and a p-side electrode wiring 22.

As illustrated in FIG. 1B, the optical module 10 includes a light emitting area 40 and a p-side electrode pad 28.

The light emitting area 40 is an area configured as a VCSEL array including multiple light emitting units. In the present exemplary embodiment, for example, four light emitting units 50-1, 50-2, 50-3, and 50-4 (which may be collectively referred to as a "light emitting unit 50" below) formed in mesa shapes are provided. The area of each light emitting unit excluding an emission aperture is covered with the p-side electrode wiring 22, so that the respective light emitting units are electrically connected in parallel to each other. The p-side electrode pad 28 is a pad to which a positive electrode of a power supply is connected when connecting the power supply which supplies current to the light emitting area 40 via the p-side electrode wiring 22. In addition, a negative electrode of the power supply is connected to the n-side electrode wiring 30 which is formed on the back surface of the substrate 12. With the configuration described above, when power is supplied to the VCSEL array, light is emitted from the respective light emitting units substantially simultaneously.

Assuming that the oscillation wavelength of the optical module 10 is $\lambda$ and the refractive index of a medium (semiconductor layer) is n, the n-type lower DBP 14 formed on the substrate 12 is a multilayered-film reflector configured by alternately and repeatedly stacking two semiconductor layers which have a film thickness of 0.25 $\lambda$/n and have different refractive indices.

The active layer area 16 formed on the lower DBR 14 is an area that generates light to be emitted from the light emitting unit 50. The active layer area 16 includes a lower spacer 114, a quantum well active layer 116, and an upper spacer 118 which are formed in this order on the lower DBR 14 (see FIGS. 6A to 6F).

The quantum well active layer 116 according to the present exemplary embodiment may be configured with, for example, barrier layers of four GaAs layers and quantum well layers of three InGaAs layers each provided between the adjacent GaAs layers. In addition, the lower spacer 114 and the upper spacer 118 are respectively disposed between the quantum well active layer 116 and the lower DBR 14 and between the quantum well active layer 116 and the upper DBR 18. With this configuration, the lower spacer 114 and the upper spacer 118 have a function of adjusting the length of a resonator and serve as clad layers for confining carriers.

The p-type oxide confinement layer 26, provided on the active layer area 16, is a current confinement layer. The p-type oxide confinement layer 26 includes a non-oxidized area 26a and an oxidized area 26b. The current flowing from the p-side electrode pad 28 toward the n-side electrode wiring 30 is narrowed (confined) by the non-oxidized area 26a.

The upper DBR 18, formed on the oxide confinement layer 26, is a multilayered-film reflector formed by alternately and repeatedly stacking two semiconductor layers which have a film thickness of 0.25 $\lambda$/n and have different refractive indices.

On the upper DBR 18, an emission surface protection layer 24 is provided to protect a light emission surface. The emission surface protection layer 24 is formed, for example, by depositing a silicon nitride film.

As illustrated in FIGS. 1A and 1B, the interlayer insulating film 20 as an inorganic insulating film is deposited around a semiconductor layer including the mesa of the light emitting unit 50. The inter layer insulating film 20 is disposed below the p-side electrode wiring 22 and the p-side electrode pad 28. The interlayer insulating film 20 according to the present exemplary embodiment is formed of, for example, a silicon nitride film (SiN film). It should be noted that the material of the interlayer insulating film 20 is not limited to the silicon nitride film. The material of the interlayer insulating film 20 may be, for example, a silicon oxide film ($SiO_2$ film) or a silicon oxynitride film (SiON film).

As illustrated in FIG. 1A, the p-side electrode wiring 22 is connected to the upper DBR 18 through an opening in the interlayer insulating film 20. A contact layer 124 (see FIGS. 6A to 6F) for connection with the p-side electrode wiring 22 is provided in the uppermost layer of the upper DBR 18. One end side of the p-side electrode wiring 22 is connected to the upper DBR 18 via the contact layer 124 and forms an ohmic contact with the upper DBR 18.

Meanwhile, a VCSEL, which constitutes the light emitting unit 50 of the optical module 10, is suitably used, for example, as a light source for optical communication because the VCSEL provides a laser output in a direction perpendicular to the substrate and further facilitates array formation by two-dimensional integration.

The optical module includes a pair of distributed Bragg reflectors (the lower DBR 14 and the upper DBR 18) provided on a semiconductor substrate (the substrate 12) and an active layer area (the active layer area 16) provided between the pair of distributed Bragg reflectors. The optical module is configured such that current is injected into the active layer area by electrodes (the p-side electrode wiring 22 and the n-side electrode wiring 30) provided on the opposite sides of the distributed Bragg reflectors, laser oscillation is generated perpendicularly to the substrate surface, and oscillated light is emitted from the top of an element (the surface side of the emission surface protection layer 24).

In addition, an oxide confinement layer (the oxide confinement layer 26) which is formed by oxidizing a semiconductor layer containing Al in the composition thereof is provided in terms of, for example, low threshold current and controllability of a transverse mode. In order to oxidize the semiconductor layer containing Al, the element is etched into a mesa shape and is subjected to an oxidation treatment. Thereafter, the mesa-shaped side surface exposed by the etching processing and the etched semiconductor surface are generally covered with an insulating material such as a silicon nitride film or a silicon oxide film.

Meanwhile, semiconductor lasers such as VCSELs, or light emitting elements including, for example, light emitting diodes (LEDs) generally nave inherent service lives. In an apparatus such as an optical communication system using a light emitting element, when the light emitting element is getting closer to the end of the service life thereof, it is necessary to replace the light emitting element before a serious trouble occurs. To this end, it is necessary to continuously monitor the light emitting element and to detect deterioration of the light emitting element. There may be a case where the light emitting element is driven with a constant current (or driven with a constant voltage) in order to maintain a constant optical output. For the light emitting element under such a driving manner, for example, the optical output of the light emitting element is monitored, and it is detected that the light emitting element deteriorates, based on the fact that the optical output falls below a predetermined threshold.

Meanwhile, in a semiconductor laser, without being limited to a VCSEL, it may be required in some cases to stabilize an optical output so as to prevent the optical output from fluctuating due to, for example, variation in temperature or variation in power. As the stabilization method, there is an automatic power control (APC) method. The APC method is a method of detecting the optical output of a semiconductor laser as monitor current by, for example, a monitor photo diode (PD), comparing the detected monitor current with a reference value to obtain a differential value, changing the driving current using the differential value, and performing negative feedback control on the optical output of the semiconductor laser.

Even if the optical output of the semiconductor laser is controlled to be constant by the APC method, when the semiconductor laser deteriorates over time, the driving current of the semiconductor laser may rise and may not be controllable. Therefore, in a case where an apparatus including a light emitting element uses the APC control method, it is detected that the light emitting element deteriorates, for example, based on the fact that the driving current of the light emitting element exceeds a predetermined threshold.

Regardless of whether the driving method of the light emitting element is a constant-current (constant-voltage) driving method or an APC driving method, once it is detected that the light emitting element deteriorates, it is necessary to urge a user of the apparatus equipped with the light emitting element to replace, for example, a part including the light emitting element. However, in an optical module having a configuration to detect whether a light emitting element deteriorates for the purpose of urging the user to replace the optical module, when the deterioration is detected just before the light emitting element becomes unusable, the time to replace would be limited and as a result, the user's convenience might be impaired.

Therefore, in the optical module 10 according to the present exemplary embodiment, in addition to a first light emitting element having an original light emitting function, a second light emitting element which deteriorates earlier is connected in parallel with the first light emitting element, and it is detected whether the second light emitting element deteriorates. With this configuration, when it is detected that the second light emitting element deteriorates, the user is urged to replace the optical module. Therefore, the user has enough time to replace.

A deterioration detection method in the optical module 10 according to the present exemplary embodiment will be described with reference to FIGS. 2A to 2F and FIGS. 3A to 3D. The optical module 10 includes multiple light emitting units 50 including a light emitting unit 50 having a short service life. That is, the optical module 10 includes, in addition to a light emitting unit 50 that performs a normal light emitting operation (hereinafter, may be referred to as a "normal light emitting unit 50n"), a light emitting unit 50 which has a service life shorter than that of the normal light emitting unit 50n and monitors a deterioration of the normal light emitting unit 50n (hereinafter, may be referred to as a "monitor light emitting unit 50m").

Figure 2A:
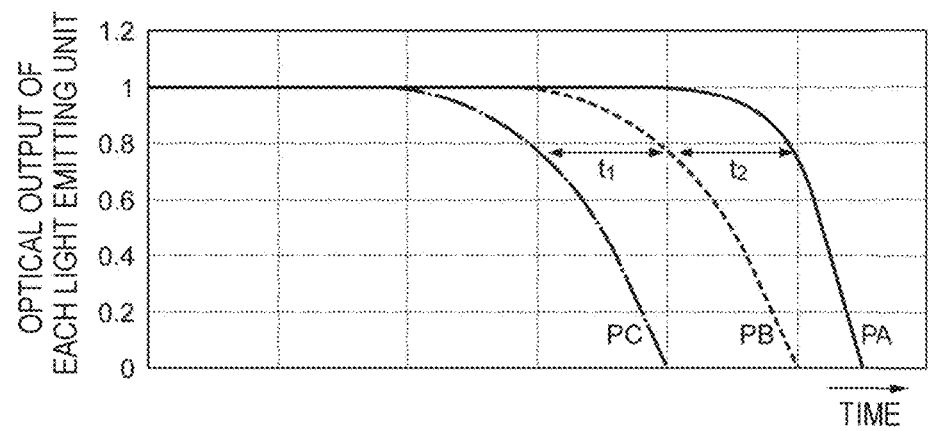
FIG. 2A is a graph illustrating a temporal change in optical output of light emitting units having different service lives.

First, a temporal change in optical output of the optical module 10 including light emitting units 50 having different service lives will be described with reference to FIGS. 2A to 2F. FIG. 2A illustrates temporal changes in optical output of three light emitting units having different service lives, that is, a light emitting unit A, a light emitting unit B, and a light emitting unit C. The service life of the light emitting unit A is longer than the service life of the light emitting unit B, and the service life of the light emitting unit B is longer than the service life of the light emitting unit C. In FIG. 2A, a temporal change in optical output of the light emitting unit A is indicated by curve PA, a temporal change in optical output of the light emitting unit B is indicated by curve PB, and a temporal change in optical output of the light emitting unit C is indicated by curve PC. It should be noted that in FIG. 2A, the initial value of the optical output of each light emitting unit is normalized to 1. In the present exemplary embodiment, the light emitting unit A is the normal light emitting unit 50n, and the light emitting unit B and the light emitting unit C are the monitor light emitting units 50m. The light emitting unit A, which constitutes the normal light emitting unit 50n, includes a single light emitting unit A or multiple light emitting units A. The light emitting unit A has a rated output capable of outputting a required optical output of the optical module 10.

Here, if the VCSEL array is configured only with multiple light emitting units A, the multiple light emitting units A reach the end of their service lives at the same time, which makes it difficult to further use the optical module 10. Even if the user is urged to replace the optical module 10 by detecting a deterioration based on the optical output indicated by the curve PA, the period until the optical module becomes difficult to use might be short at the time when the deterioration of the light emitting unit A is detected, and as a result, some users might miss the time of performing the replacement before the optical module becomes difficult to use.

Therefore, the optical module 10 according to the present exemplary embodiment includes the light emitting unit B and the light emitting unit C which have service lives shorter than that of the light emitting unit A, as the monitor light emitting units 50m. The optical module 10 grasps that the optical module 10 is getting closer to the end of the service life thereof, by detecting a deterioration of the light emitting unit B or the light emitting unit C. Then, a notification to urge the user to, for example, replace the optical module 10 is issued (hereinafter, may be referred to as "an alert is issued") before the optical module 10 reaches the end of its service life. As illustrated in FIG. 2A, the service life of the light emitting unit B is set to be shorter than that of the light emitting unit A by a period $t_2$, and the service life of the light emitting unit C is set to be shorter than that of the light emitting unit B by a period $t_1$. That is, the service life of the light emitting unit C is set to be shorter than that of the light emitting unit A by a period $(t_1+t_2)$. There is no specific limitation as to the periods $t_1$ and $t_2$ so long as the user has an enough period until he/she replaces the optical module 10. For example, the period $t_1$ and $t_2$ may be set to about one month to two months. As described above, the optical module 10 according to the present exemplary embodiment detects a deterioration with the monitor light emitting unit 50m earlier than the deterioration of the normal light emitting unit 50n.

As will be described below, only the light emitting unit C or only the light emitting unit 13 may be provided as the monitor light emitting unit 50m, or both the light emitting unit B and the light emitting unit C may be provided as the monitor light emitting unit 50m. In addition, a light emitting unit having a service life shorter than that of the light emitting unit C may be provided. Providing the monitor light emitting units 50m having multiple service lives makes it possible to issue alerts in a stepwise manner.

FIGS. 216 to 21F illustrate examples of the arrangement of the normal light emitting unit(s) 50n and the monitor light emitting unit(s) 50m in the light emitting area 40 of the optical module 10. The arrangement of the normal light emitting unit(s) 50n and the monitor light emitting unit(s) 50m is not particularly limited in the present exemplary embodiment. FIGS. 2B to 2F illustrate the examples of the arrangement under the assumption of coupling to an optical fiber, in consideration of the application to an optical transmission device 200 which will be described later.

Figure 2B:
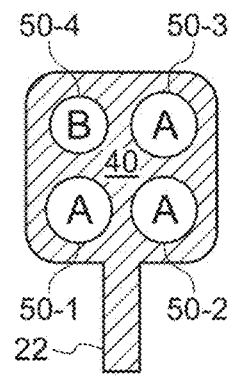
FIGS. 2B to 2F are plan views of the optical modules in which the light emitting units having different service lives are disposed in various forms.

FIG. 2B illustrates a mode in which four light emitting units are disposed in total and include three light emitting units A (light emitting units 50-1, 50-2, and 50-3) which are the normal light emitting units 50n, and one light emitting unit B (light emitting unit 50-4) which is the monitor light emitting unit 50m. In the following description, the light emitting units B and C are illustrated as being smaller than the light emitting unit A. However, it should be noted that the schematic models represent a long service life and a short service life and that the actual physical sizes of the light emitting units B and C are not necessarily smaller than that of the light emitting unit A.

Figure 2C:
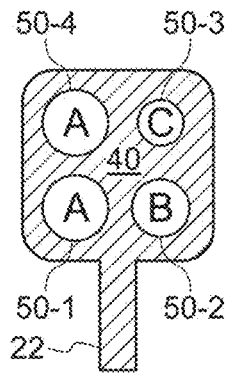

FIG. 2C illustrates a mode in which four light emitting units are disposed in total and include two light emitting units A (light emitting units 50-1 and 50-4) which are the normal light emitting units 50n, one light emitting unit B (light emitting unit 50-2) which is the monitor light emitting unit 50m, and one light emitting unit C (light emitting unit 50-3) which is the monitor light emitting unit 50m. With this arrangement form, an alert is issued by the light emitting unit C, and thereafter an alert is issued by the light emitting unit B. Therefore, alerts are issued in a stepwise manner.

Figure 2D:
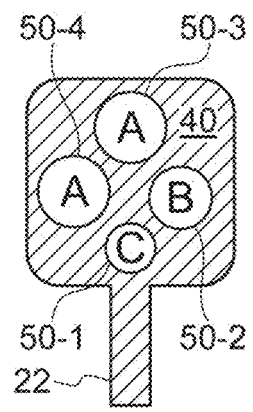

FIG. 2D illustrates a mode in which four light emitting units are disposed in total and include two light emitting units A (light emitting units 50-3 and 50-4) which are the normal light emitting units 50n, one light emitting unit B (light emitting unit 50-2) which is the monitor light emitting unit 50m, and one light emitting unit C (light emitting unit 50-1) which is the monitor light emitting unit 50m. With this arrangement form, alerts are issued in a stepwise manner.

Figure 2E:
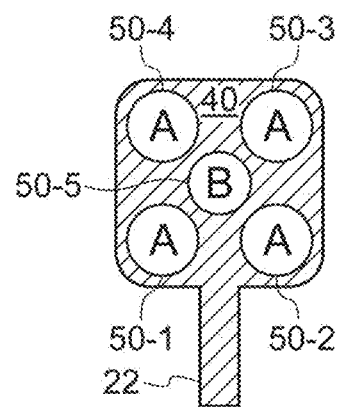
Figure 2F:
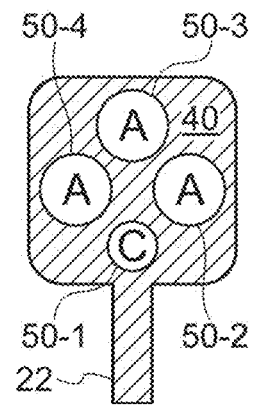

FIG. 2E illustrates a mode in which five light emitting units are disposed in total and include four light emitting units A (light emitting units 50-1, 50-2, 50-3 and 50-4) which are the normal light emitting units 50n, and one light emitting unit B (light emitting unit 50-5) which is the monitor light emitting unit 50m. FIG. 2F illustrates a mode in which four light emitting units are disposed in total and include three light emitting units A (light emitting units 50-2, 50-3 and 50-4) which are the normal light emitting units 50n, and one light emitting unit C (light emitting unit 50-1) which is the monitor light emitting unit 50m.

In the above-described modes, the relationship between the number of normal light emitting units 50n and the number of monitor light emitting units 50m is not particularly limited. When the number of normal light emitting units 50n is greater than the number of monitor light emitting units 50m, the time taken until the normal light emitting unit 50n reaches the end of their service life (until the optical module reaches the end of its service life) after it is detected that the monitor light emitting unit 50m deteriorates is increased, compared to a case where the number of normal light emitting units 50n is smaller than the number of monitor light emitting units 50m. That is, in the APC control method, the identical amount of light is emitted only by the remaining normal light emitting unit 50n after the monitor light emitting unit 50m first reaches the end of its service life. An increment in amount of light per each normal light emitting unit 50n is reduced as the number of normal light emitting units 50n increases. Therefore, as the number of normal light emitting units 50n increases, for example, heat generation due to the increment in amount of light is suppressed and the time taken until the normal light emitting unit 50n reaches the end of its service life becomes longer. As a result, the user has an enough period until the optical module reaches the end of its service life after a notification urging the user to replace the optical module is issued, that is, an enough grace period until the replacement is provided.

Next, a timing at which the optical module 10 according to the present exemplary embodiment issues an alert will be described with reference to FIGS. 3A to 3D, compared to an optical module according to a comparative example.

Figure 3A:
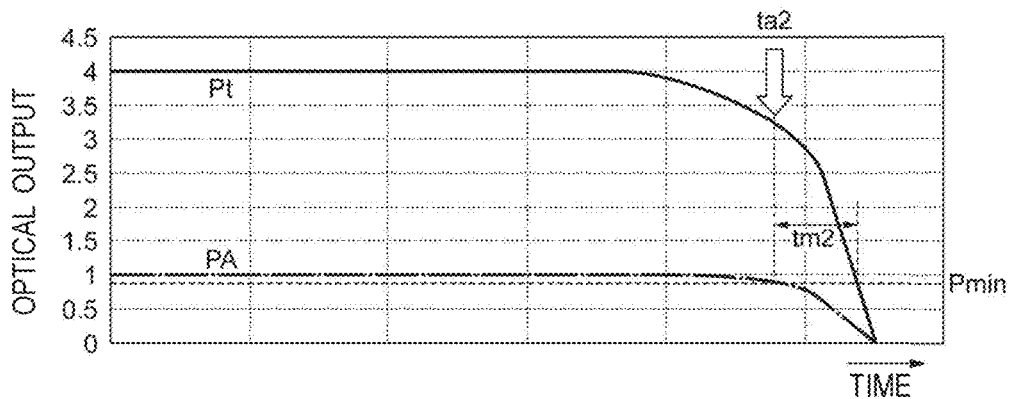
FIG. 3A is a graph illustrating a temporal change in optical output of the optical module in which light emitting units having the identical service life are disposed.
Figure 3B:
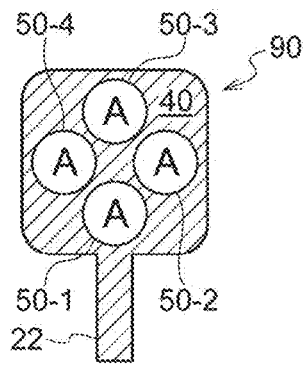
FIG. 3B is a plan view of the optical module.

FIG. 3B illustrates a plan view of an optical module 90 according to the comparative example in which only four light emitting units A (light emitting units 50-1 to 50-4) which are the normal light emitting units 50n are disposed. FIG. 3A illustrates a temporal change in optical output of the optical module 90. The curve PA represents a temporal change in optical output of one light emitting unit A when the initial value thereof is normalized to 1. The curve Pt represents temporal change in optical output of four light emitting units A, that is, the optical module 90. The initial value of the optical output indicated by the curve Pt is 4, which is equivalent to a sum of the optical outputs of four light emitting units A. At this time, assuming that an alert is issued at the optical output of about 3.3, the optical module 90 according to the comparative example issues an alert at time ta2. Assuming that the minimum optical output required in the optical module 90 (optical output at which it is determined that the optical module 90 reaches the end of its service life) is the lower limit optical output value Pmin as illustrated in FIG. 3A, the grace period until replacement is a period tm2 (hereinafter referred to as "replacement grace period").

Figure 3C:
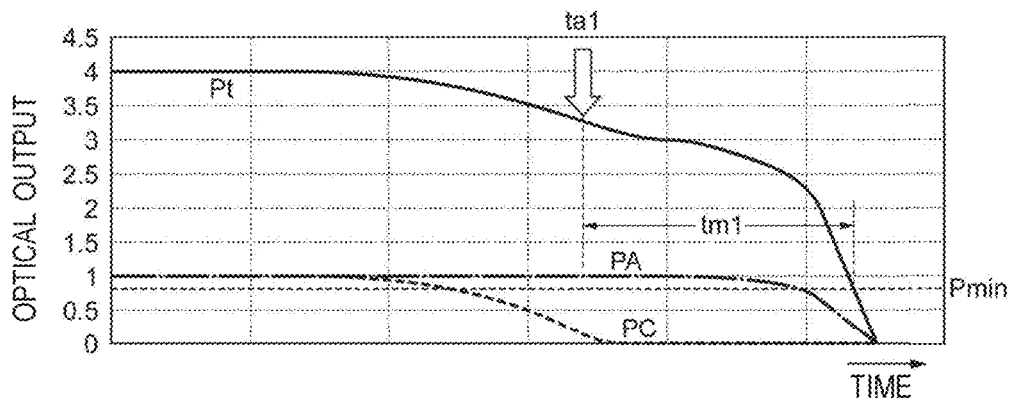
FIG. 3C is a graph illustrating a temporal change in optical output of the optical module according to the exemplary embodiment.
Figure 3D:
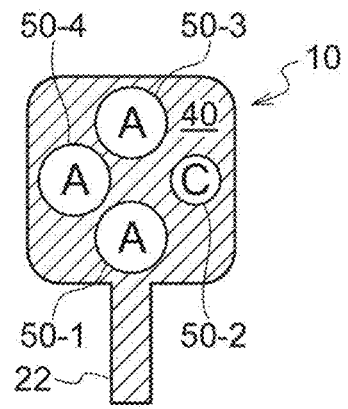
FIG. 3D is a plan view of the optical module.

FIG. 3D illustrates the optical module 10 according to the present exemplary embodiment in which three light emitting units A (light emitting units 50-1, 50-3, and 50-4) and one light emitting unit C (light emitting unit 50-2) are provided. FIG. 3C illustrates a temporal change in optical output of the optical module 10. The curve PA in FIG. 3C is the same curve as the curve PA illustrated in FIG. 3A. The curve PA illustrates a temporal change in optical output of one light emitting unit A. On the other hand, the curve PC represents a temporal change in optical output of one light emitting unit C which is the monitor light emitting unit 50m. As illustrated in FIG. 3C, the light emitting unit C deteriorates earlier than the light emitting unit A, and the optical output of the light emitting unit C decreases earlier.

The curve Pt in FIG. 3C represents a temporal change in optical output of the optical module 10, that is, a temporal change in total optical output of the three light emitting units A and the one light emitting unit C. As illustrated in FIG. 3C, the optical output of the optical module 10 decreases earlier than that of the optical module 90 according to the comparative example, due to the presence of the light emitting unit C. Here, in the same manner as in FIG. 3A, assuming that an alert is issued at the optical output of 3.3 and the optical output at which it is determined that the optical module reaches the end of its service life is the lower limit optical output value Pmin, the grace period of the optical module 10 until replacement is the replacement grace period tm1. As is apparent from FIGS. 3A and 3C, tm1 is greater than tm2, and the optical module 10 according to the present exemplary embodiment has an expanded replacement grace period, compared to the optical module 90 according to the comparative example.

Next, a deterioration detection method in the optical module 10 according to the present exemplary embodiment will be described with reference to FIGS. 4A to 4C and FIGS. 5A and 5B. In the optical module 10 according to the present exemplary embodiment, APC driving is adopted as a driving method of the light emitting area 40.

Figure 4A:
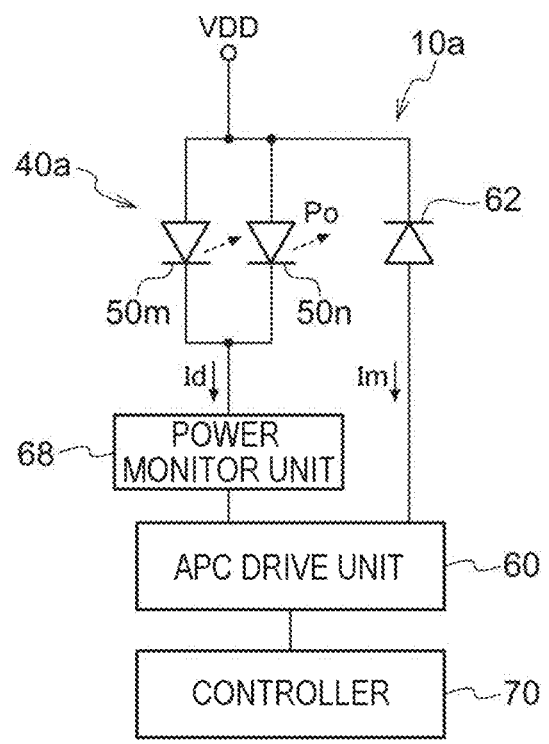
FIG. 4A is a circuit diagram illustrating a drive unit of the optical module according to a first exemplary embodiment.

FIG. 4A illustrates a circuit diagram of an optical module 10a according to the present exemplary embodiment which is configured by adding a drive circuit for the light emitting area 40 to the optical module 10. As illustrated in FIG. 4A, the optical module 10a includes a light emitting area 40a including the normal light emitting unit 50n and the monitor light emitting unit 50m as the optical module 10, a monitor PD 62, and an APC drive unit 60. An anode (p-side electrode pad 28) of the normal light emitting unit 50n, an anode (p-side electrode pad 28) of the monitor light emitting unit 50m, and a cathode of the monitor PD 62 are connected to a power supply VDD. In addition, the APC drive unit 60 may be monolithically integrated with the optical module 10. Alternatively, the APC drive unit 60 maybe formed of a semiconductor element different from the optical module 10, and both of the APC drive unit 60 and the optical module 10 may be connected to each other via, for example, a bonding wire.

The light emitting area 40a of the optical module 10a adopts the same configuration as the light emitting area 40 illustrated in FIG. 3D. That is, the light emitting area 40a includes the three light emitting units A (only one representative is illustrated in FIG. 4A) as the normal light emitting units 50n and the one light emitting unit C as the monitor light emitting unit 50m. In the present exemplary embodiment, the number of normal light emitting units 50n and the number of monitor light emitting units 50m are not particularly limited, so long as at least one normal light emitting unit 50n and at least one monitor light emitting unit 50m are provided.

The APC drive unit 60 is a drive circuit that drives the light emitting area 40a by the APC method. That is, the monitor PD 62 receives an optical output Po emitted from the light emitting area 40a (the normal light emitting units 50n and the monitor light emitting unit 50m). Monitor current Im which is generated in the monitor PD 62 according to the optical output Po is input to the APC drive unit 60. The APC drive unit 60 converts the monitor current Im into a voltage signal, and controls driving current Id flowing to the light emitting area 40a based on a difference between the voltage signal and a reference voltage which indicates the target value of the optical output Po.

A power monitor unit 68 includes, for example, a current-voltage conversion circuit. The power monitor unit 68 converts the driving current Id flowing to the light emitting area 40a into a voltage signal, thereby detecting the magnitude of the driving current Id as the voltage signal. Then, the power monitor unit 68 transmits the detected voltage signal to a controller 70.

The controller 70 is configured with hardware and/or software. The controller 70 detects whether the optical module 10a deteriorates, based on the voltage signal which indicates the magnitude of the driving current Id. That is, the controller 70 serves as a detection unit which detects whether the monitor light emitting unit 50m provided in the optical module 10a deteriorates, together with the power monitor unit 68.

Figure 4B:
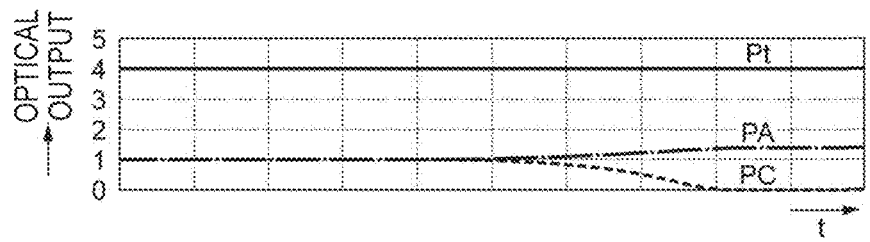
FIG. 4B is a graph illustrating a temporal change in optical output.

As illustrated in FIG. 4A, in the optical module 10a, the normal light emitting units 50n and the monitor light emitting unit 50m, which constitute the light emitting area 40a, are connected in parallel with each other. The driving current Id is made to collectively flow to a total of four light emitting units 50. Therefore, the monitor PD 62 receives the optical output Po obtained by combining the light emitted from the four light emitting units 50. It should be noted that a modulation signal (not illustrated) (for example, a transmission data signal of the optical transmission device which will be described later) which modulates the optical output Po of the optical module 10a is also input to the APC drive unit 60. Therefore, the driving current Id is current obtaining by adding (i) bias current which biases the light emitting area 40a and (ii) current of the transmission data signal, In FIG. 4B, the curve Pt represents a temporal change in the optical output Po emitted from the light emitting area 40. Since the optical module 10a adopts APC control, the optical output Po remains at a substantially constant value as illustrated in FIG. 4B. At that time, looking at a temporal change in optical output of each light emitting unit 50, the light emitting units A having a relatively long service life show a substantially constant temporal change as represented by the curve PA in FIG. 4B. On the other hand, since the light emitting unit C having a short service life deteriorates during operation, the optical output of the light emitting unit C decreases during operation. However, since the optical module 10a adopts the APC control method, the optical output of the optical module 10a does not decrease, but shows a substantially constant value as represented by the curve Pt, despite a reduction in the optical output of the light emitting unit C.

Figure 4C:
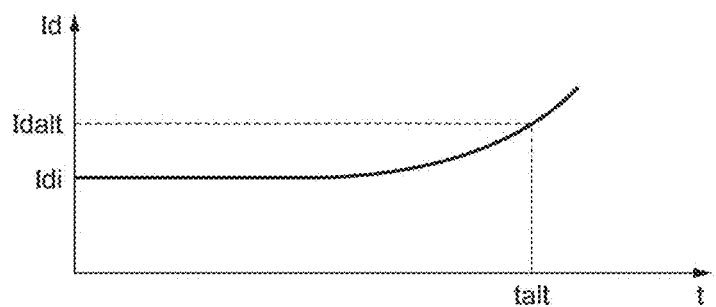
FIG. 4C is a graph illustrating a temporal change in driving current.

FIG. 4C illustrates a temporal change in the driving current Id of the optical module 10a. As illustrated in FIG. 4C, the driving current Id of the optical module 10a shows a substantially constant value with starting from an initial driving current value Idi for a certain period. However, in order to keep the optical output Po constant, the driving current Id increases due to a deterioration of the light emitting unit 50. The deterioration of the light emitting unit 50 may be caused by a deterioration of the normal light emitting units 50n in some cases, but is mainly caused by a deterioration of the monitor light emitting unit 50m. In the optical module 10a, a deterioration of the light emitting area 40a is monitored by monitoring an increase in driving current Id.

The optical module 10a detects the sign of the deterioration with the monitor light emitting unit 50m before the optical module 10a becomes difficult to use due to a deterioration of the normal light emitting unit 50n, and issues an alert. Thereby, the grace period until the user's replacement increases. In FIG. 4C, a driving current alert value Idalt represents the value of the driving current Id that causes an alert to be issued. The alert is issued at a time talt that corresponds to the driving current alert value Idalt. That is, if the driving current Id is equal to or less than the driving current alert value Idalt, a deterioration of the optical module 10a is not detected, and if the driving current Id exceeds the driving current, alert value Idalt, a deterioration of the optical module 10a is detected.

Figure 5A:
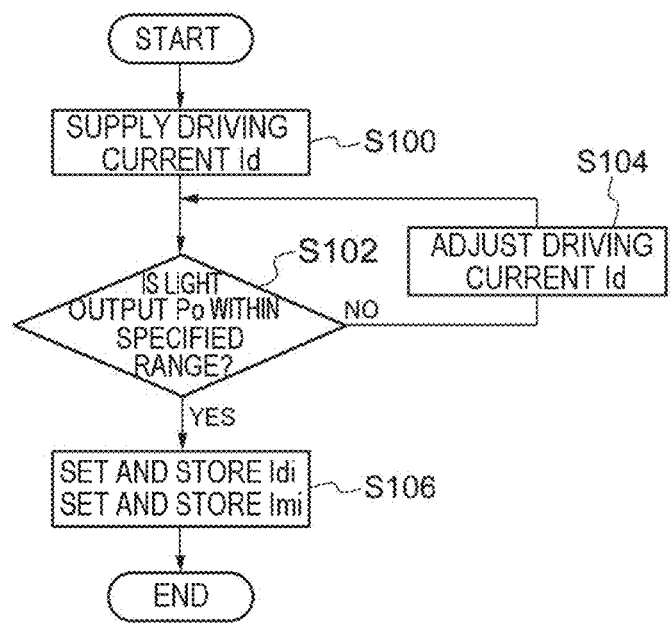
FIG. 5A is a flowchart illustrating the flow of initial setting processing of the optical module according to the first exemplary embodiment.
Figure 5B:
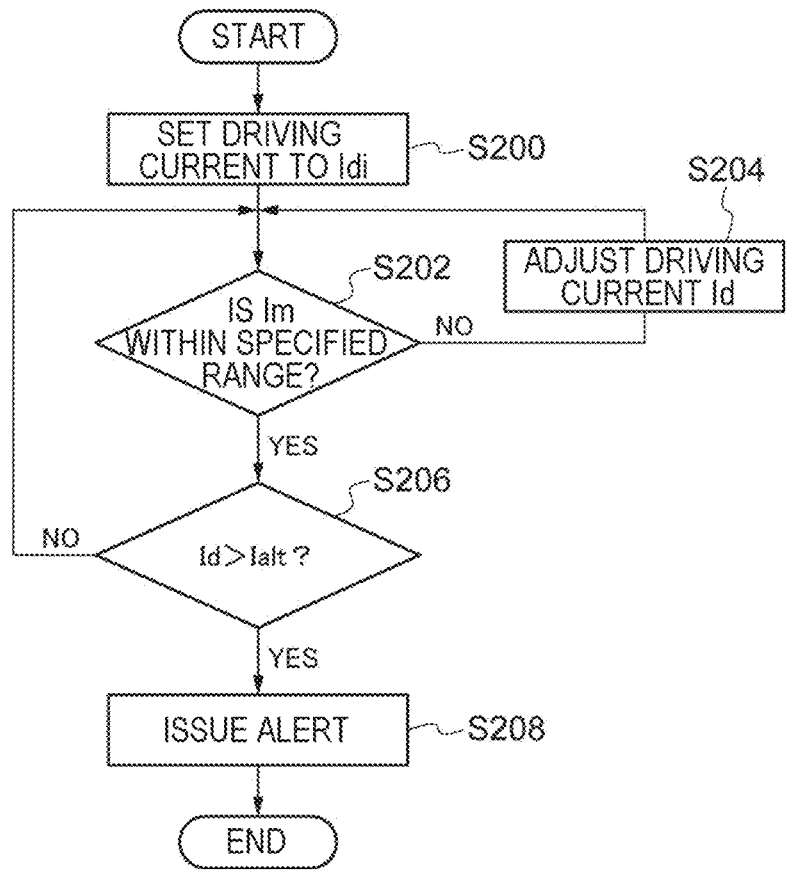
FIG. 5B is a flowchart illustrating the flow of driving control processing.

Next, a driving control method of the optical module 10a will be described with reference to FIGS. 5A and 5B. FIG. 5A is a flowchart illustrating the flow of initial value setting processing for setting (i) the initial driving current value Idi, which is the initial value of the driving current Id of the optical module 10a and (ii) an initial monitor current value Imi which is the initial value of the monitor current Im. For example, the initial value setting processing is executed in advance by a manufacturer before shipment of a product. FIG. 5B is a flowchart illustrating the flow of driving control processing for controlling the driving current in the operating state of the optical module 10a. The driving control processing is mainly executed for a period during which the user uses the optical module 10a.

The initial value setting processing according to the present exemplary embodiment will be described with reference to FIG. 5A.

First, in step S100, the driving current Id is supplied to the light emitting area 40a (the normal light emitting units 50n and the monitor light emitting unit 50m) of the optical module 10a.

Next, in step S102, it is determined whether or not the optical output Po is within the range of specified values, that is, whether or not the optical output Po is within the range of initial setting values. The initial setting value is set based on, for example, the design conditions of the optical module 10a. If the determination is affirmative, the processing proceeds to step S106. If the determination is negative, the processing proceeds to step S104.

In step S104, after the driving current Id is adjusted so that the optical output Po falls within the range of the specified values, the processing returns to step S102 and it is determined again whether or not the optical output Po is within the range of the specified values.

In step S106, the driving current Id at that time is set as the initial driving current value Idi, and is stored in a memory such as a random access memory (RAM) provided in the controller 70. In addition, the monitor current Im at that time is stored in the memory as the initial monitor current value Imi. Thereafter, the initial value setting processing ends.

Next, the driving control processing until an alert is issued in the optical module 10a will be described with reference to FIG. 5B.

First, in step S200, the initial driving current value Idi, which is set in the initial value setting processing, is supplied as the driving current Id to the light emitting area 40a (the normal light emitting units 50n and the monitor light emitting unit 50m) of the optical module 10a.

Next, in step S202, it is determined whether or not the monitor current Im is within the range of specified values. More specifically, it is determined whether or not the monitor current Im is within a predetermined range having a center at the initial monitor current value Imi. If the determination is negative, the processing proceeds to step S204, and the driving current Id is adjusted so that the monitor current Im falls within the range of the specified values. Then, the processing returns to step S202, and it is determined again whether or not the monitor current Im is within the range of the specified values. It should be noted that the loop of steps S202 and S204 indicates the APC control according to the present exemplary embodiment.

On the other hand, if the determination is affirmative in step S202, the processing proceeds to step S206, and it is determined whether or not the driving current Id is within the range of specified values. That is, it is determined whether or not the driving current Id exceeds the driving current alert value Idalt.

If the determination is negative in step S206, the processing returns to step S202, and it is determined again whether or not the monitor current Im is within the range of the specified values.

On the other hand, if the determination is affirmative in step S206, the processing proceeds to step S208, and an alert is issued. Thereafter, the driving control processing ends. It should be noted that the APC control continues even after the alert is issued. Therefore, the light emission from the optical module 10a is maintained.

The driving control in FIG. 5B is executed by the controller 70 controlling, for example, the APC drive unit 60. In addition, the driving current alert value Idalt in step S206 is determined in advance by, for example, a manufacturer. The determination in step S206 is made by hardware and/or software which constitutes the controller 70. In a case of making the determination by the hardware, a comparison circuit such as a comparator compares the voltage signal which indicates the magnitude of the driving current Id from the power monitor unit 68 with a reference voltage value which corresponds to the driving current alert value Idalt, for determination. On the other hand, in a case of making the determination by the software, a processor such as a CPU that operates the software is provided, and the voltage signal, which indicates the magnitude of the driving current Id converted into a digital signal, is compared on the software with the driving current alert value Idalt stored in the RAM of the controller 70 in advance. That is, the controller 70 serves as a detection unit which detects whether or not the monitor light emitting unit 50m deteriorates, together with the power monitor unit 68.

In the optical module 10a according to the present exemplary embodiment, as illustrated in FIGS. 4C and 5B, the mode in which the driving current alert value Idalt is set with respect to the driving current Id to issue an alert is described by way of example. Alternatively, multiple driving current alert values Idalt having different current values may be set, and notification contents or notification methods of alerts may be changed in a stepwise manner for the respective driving current alert values Idalt. For example, as the deterioration progresses, the user may be notified of a message or the like that requests replacement more strongly.

Next, a method of manufacturing the optical module 10 according to the present exemplary embodiment will be described with reference to FIGS. 6A to 6F. The optical module 10 includes the four light emitting units 50 as illustrated in FIG. 1B. The light emitting units 50 are manufactured by the same manufacturing process. Thus, in the following description, one of the light emitting units 50 will be illustrated and described. It should be noted that in FIGS. 6A to 6F, components having the same names but different reference numerals from those in FIGS. 1A and 1B have the same functions.

Figure 6A:
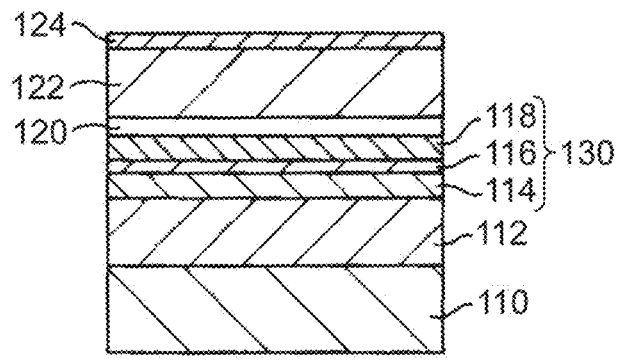
FIGS. 6A to 6F are cross-sectional views illustrating an example of a method of manufacturing an optical module according to an exemplary embodiment.

First, as illustrated in FIG. 6A, an n-type lower DBR 112, an active layer area 130, a p-type AlAs layer 120, a p-type upper DBR 122, and the contact layer 124 are sequentially stacked on a substrate 110 formed of n-type GaAs by the metal organic chemical vapor deposition (MOCVD) method. The n-type lower DBR 112 is formed by stacking 30 pairs of AlAs and GaAs so that each film thickness becomes one quarter of the intra-medium wavelength $\lambda'$ ($=\lambda/n$). The n-type lower DBR 112 has a carrier concentration of $1\times10^{18}$ cm$^{-3}$. The active layer area 130 includes the lower spacer 114 formed of undoped $Al_{0.22}Ga_{0.78}As$, the undoped quantum well active layer 116 (configured with three InGaAs quantum well layers having a film thickness of 80 nm and four GaAs barrier layers having a film thickness of 150 nm), and the upper spacer 118 formed of undoped $Al_{0.22}Ga_{0.78}As$. A film thickness of the active layer area 130 is the intra-medium wavelength $\lambda'$. The p-type AlAs layer 120 has a carrier concentration of $1\times10^{18}$ cm$^{-3}$ and a film thickness of one quarter of the intra-medium wavelength $\lambda'$. The p-type upper DBR 122 is formed by stacking 22 pairs of $Al_{0.9}Ga_{0.1}As$ and GaAs so that each film thickness becomes one quarter of the intra-medium wavelength $\lambda'$. The p-type upper DBR 122 has a carrier concentration of $1\times10^{18}$ cm$^{-3}$. A total film thickness of the p-type upper DBR 122 is about 2 μm. The contact layer 124, is formed of p-type GaAs, has a carrier concentration of $1\times10^{19}$ cm$^{-3}$ and a film thickness of the intra-medium wavelength $\lambda'$.

The film formation is successively performed by using trimethylgallium, trimethylaluminum, trimethylindium, and arsine as a raw gas, cyclopentadinium magnesium as a p-type dopant material, and silane as an n-type dopant material, setting the substrate temperature to 750° C. during the film growth, and sequentially changing the raw gases without breaking a vacuum.

Figure 6B:
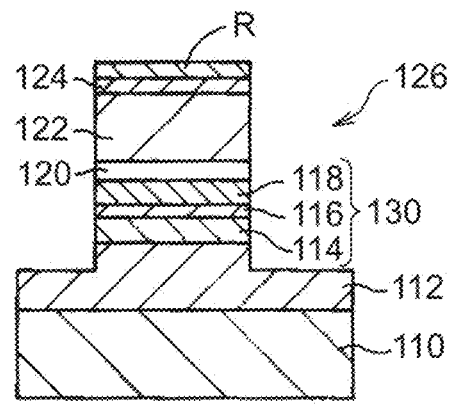

Next, as illustrated in FIG. 6B, the stacked films are etched to an intermediate portion of the lower DBR 112 to form a mesa 126, and the side surface of the AlAs layer 120 is exposed. In order to process the mesa shape, a resist mask R is formed on a crystal growth layer by photolithography, and reactive ion etching using carbon tetrachloride as an etching gas is performed.

Figure 6C:
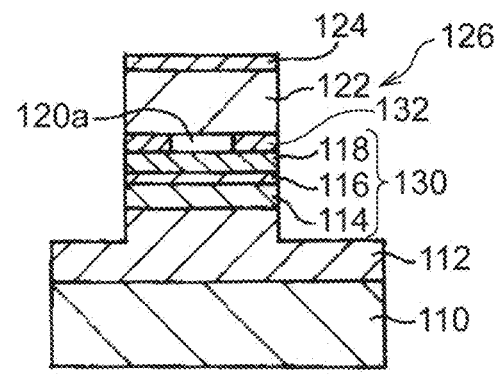

Thereafter, the resist mask R is removed. As illustrated in FIG. 6C, only the AlAs layer 120 is oxidized from the lateral side by water vapor in a furnace at about 400° C. so that the resistance thereof is increased. As a result, the AlAs layer 120 is formed into an oxidized area 132 and a non-oxidized area 120a. The diameter of the non-oxidized area 120a is, for example, about 3 μm. This non-oxidized area 120a serves as a current injection area.

Figure 6D:
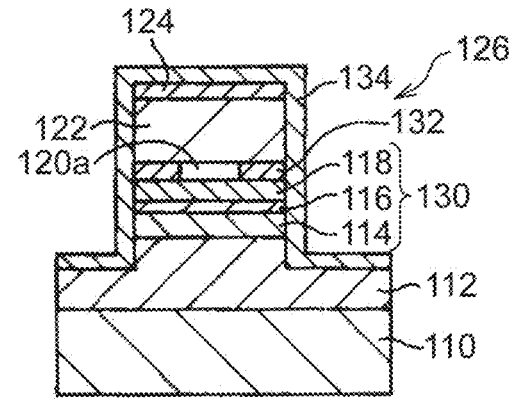
Figure 6E:
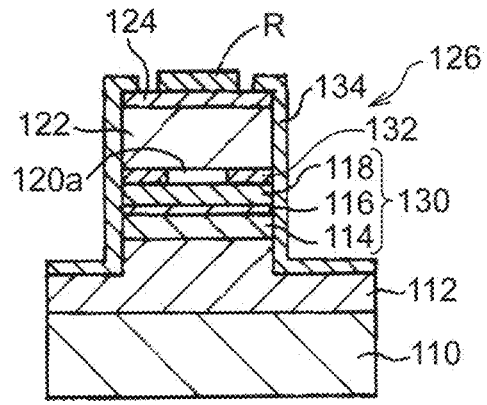
Figure 6F:
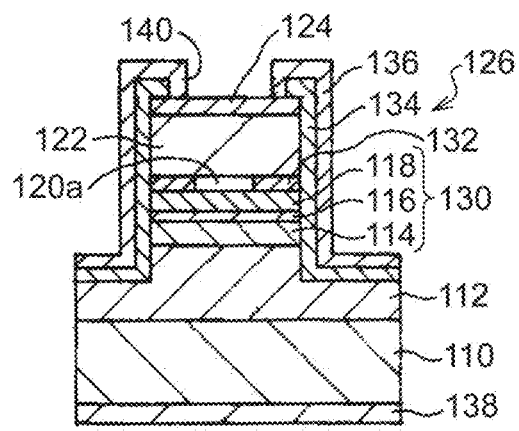

Thereafter, as illustrated in FIGS. 6D and 6E, an interlayer insulating film 134 formed of SiN is vapor-deposited thereon, except for the upper surface of the mesa 126. A p-side electrode wiring 136 formed of Ti/Au is formed thereon, except for an emission aperture 140, using the resist mask R. Au/Ge is vapor-deposited as an n-side electrode wiring 138 on the back surface of the substrate 110. In this way, the optical module 10 illustrated in FIG. 6F is completed. The mode in which the current confinement structure is formed by oxidation is described by way of an example in the present exemplary embodiment. It should be noted that the exemplary embodiments are not limited thereto. For example, a current confinement structure may be formed by ion implantation.

Next, a method of manufacturing the monitor light emitting unit 50m according to the present exemplary embodiment will be described. In the present exemplary embodiment, the normal light emitting unit 50n is manufactured by the above-described normal manufacturing process. On the other hand, the monitor light emitting unit 50m is manufactured by using either one of the following methods 1 and 2 or a combination of the two methods so that the service life of the monitor light emitting unit 50m is shorter than that of the normal light emitting unit 50n.

Method 1: Make oxidation aperture diameters (current confinement diameters) in the normal light emitting units 50n and the monitor light emitting unit 50m different from each other. The oxidation aperture diameter is the diameter of the non-oxidized area 26a (non-oxidized area 120a) which has a substantially circular shape. The oxidation aperture diameter generally ranges from about 3 μm to about 10 μm. The oxidation aperture diameter of the monitor light emitting unit 50m is set to be smaller than this diameter by about 2 μm. The smaller the oxidation aperture diameter, the shorter the service life. This is because the resistance against current flowing through the non-oxidized area 26a increases, and as a result, heat generation in the monitor light emitting unit 50m increases and the junction temperature of the monitor light emitting unit 50m increases.

Method 2: Make stresses applied to the normal light emitting unit 50n and the monitor light emitting unit 50m different from each other. Specific methods for making stresses applied to the light emitting units different include setting at least one of the thickness, the area, or the shape of the interlayer insulating film 20 (the interlayer insulating film 134) differently. With the method 2, even if the normal light emitting unit 50n and the monitor light emitting unit 50m nave the same oxidation aperture diameter, the service lives thereof are different from each other. Specifically, the thickness, area, and shape to be set may be determined based on an experiment, simulation, or the like after determining how much shorter the service life of the monitor light emitting unit 50m is set compared to the service life of the normal light emitting unit 50n.

[Second Exemplary Embodiment]

An optical module 10b according to the present exemplary embodiment will be described with reference to FIGS. 7A and 7B and FIGS. 8A and 8B. While the optical module 10a according to the above-described exemplary embodiment adopts the APC driving method, the optical module 10b adopts a constant-current driving method.

Figure 7A:
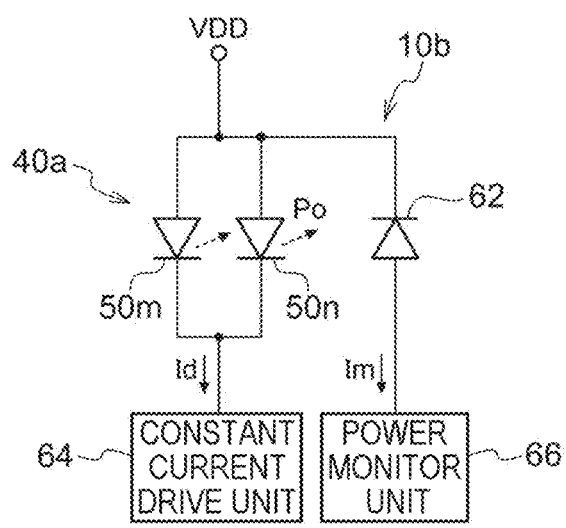
FIG. 7A is a circuit diagram illustrating a drive unit of an optical module according to a second exemplary embodiment.

FIG. 7A illustrates the optical module 10b including a drive circuit for the light emitting area 40a. As illustrated in FIG. 7A, the optical module 10b includes a light emitting area 40a, a monitor PD 62, a constant-current drive unit 64, and a power monitor unit 66, Since the light emitting area 40a is the same as the light emitting area 40a of the optical module 10a according to the above-described exemplary embodiment, a description thereof will be omitted below.

The constant-current drive unit 64 drives the light emitting area 40a with a constant current by a constant current source (not illustrated). A signal for modulating the optical output Po emitted from the light emitting area 40a, for example, a transmission data signal is input to the constant-current drive unit 64, but is not illustrated in FIG. 7A. The driving current Id is current obtained by adding a bias current and a current generated due to the transmission data signal. The constant-current drive unit 64 of the optical module 10b controls the optical output Po by keeping the bias current constant.

The power monitor unit 66 includes, for example, a current-voltage conversion circuit. The power monitor unit 66 monitors the optical output Po of the light emitting area 40a by converting the monitor current Im which is generated in the monitor PD 62 according to the optical output Po of the light emitting area 40a, into a voltage signal.

As in the first exemplary embodiment, the controller 70 is configured with hardware and/or software. The controller 70 detects whether the optical module 10b deteriorates, based on the voltage signal which indicates the magnitude of the monitor current Im. That is, the controller 70 serves as a detection unit that detects whether the monitor light emitting unit 50m provided in the optical module 10b deteriorates, together with the power monitor unit 66.

Figure 7B:
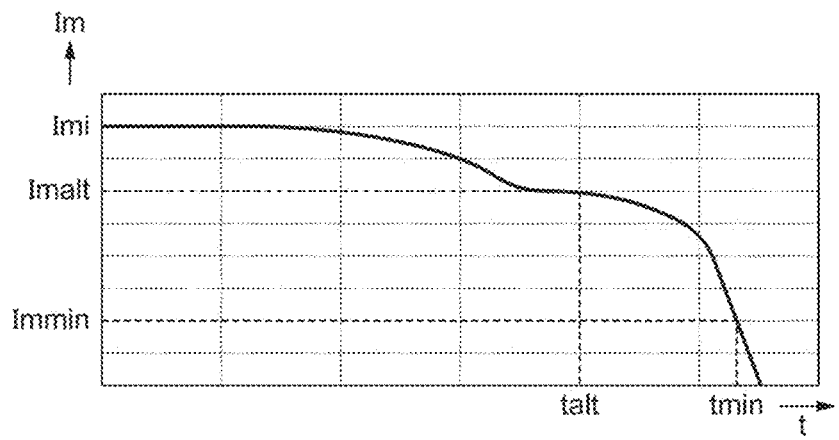
FIG. 7B is a graph illustrating a temporal change in monitor current.

FIG. 7B illustrates a temporal change in monitor current Im. As illustrated in FIG. 7B, the monitor current Im progresses at the initial monitor current value Imi for a certain period after the operation of the optical module 10b starts, and decreases as the light emitting unit 50 provided in the light emitting area 40a deteriorates. The optical module 10b monitors the light emitting unit 50 and detects a deterioration of the light emitting unit 50, based on a reduction in the monitor current Im.

In the present exemplary embodiment, the monitor current alert value Imalt is set as the monitor current value at which a deterioration is detected. The monitor current alert value Imalt is a monitor current value that corresponds to a deterioration of the light emitting unit C provided in the light emitting area 40a, and is a current value at which an alert for replacement is issued to the user. Here, the monitor current minimum value Immin in FIG. 7B is a current value at which the optical module 10b reaches the end of its service life and the amount of light from the optical module 10b decreases and becomes impossible to actually transmit a signal. Therefore, the monitor current alert value Imalt is set to a value higher than at least the monitor current minimum value Immin.

Figure 8A:
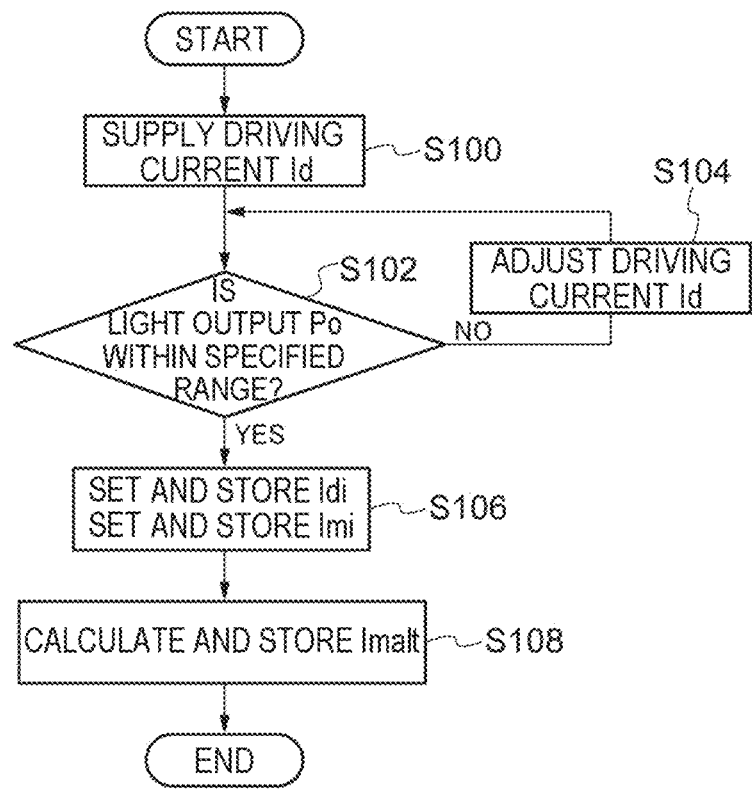
FIG. 8A is a flowchart illustrating the flow of initial setting processing of the optical module according to the second exemplary embodiment.
Figure 8B:
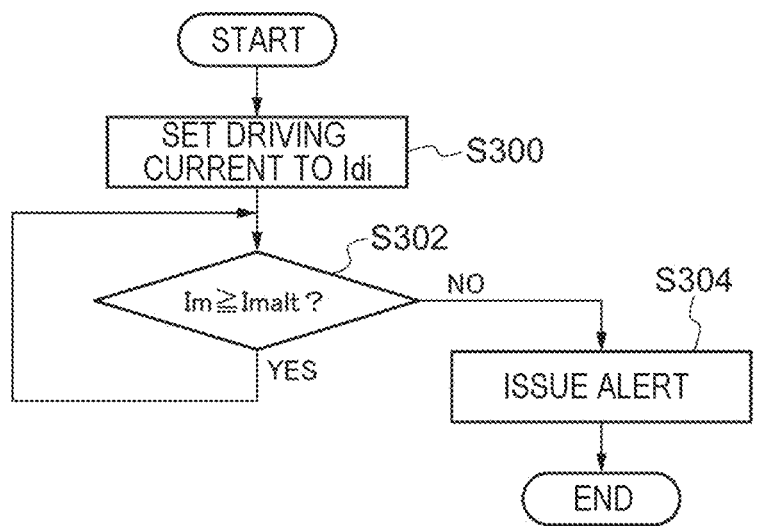
FIG. 8B is a flowchart illustrating the flow of driving control processing.

Next, a driving control method of the optical module 10b will be described with reference to FIGS. 8A and 8B. FIG. 8A is a flowchart illustrating the flow of initial value setting processing for setting (i) the initial driving current value Idi which is the initial value of the driving current Id of the optical module 10b and (ii) the initial monitor current value Imi, and further setting the monitor current alert value Imalt. Meanwhile, FIG. 8B is a flowchart illustrating the flow of driving control processing for controlling driving current in the operating state of the optical module 10b.

As illustrated in FIG. 8A, the initial value setting processing of the optical module 10b is the same as the initial value setting processing of the optical module 10a according to the above-described exemplary embodiment illustrated in FIGS. 5A and 5B from the step S100 to the step S106. Thus, the same reference numerals will be given to the steps of the same processing, and description thereof will be omitted below.

In the subsequent step S108, the monitor current alert value Imalt is calculated based on the initial monitor current value Imi set in the step S106, and is stored in the memory provided in the controller 70. The monitor current alert value Imalt may be set in the following manner. That is, a coefficient which indicates a ratio of the monitor current alert value Imalt to the initial monitor current value Imi is obtained by, for example, experiment or simulation. Then, the set initial monitor current value Imi is multiplied by the coefficient to obtain the monitor current alert value Imalt.

Next, the driving control processing until an alert is issued in the optical module 10b will be described with reference to FIG. 8B.

First, in step S300, the driving current Id is set to the initial driving current value Idi, which is set in the initial value setting processing.

Next, in step S302, it is determined whether or not the monitor current Im is equal to or greater than the monitor current alert value Imalt. If the determination is affirmative, the step S302 is looped and the operation of the optical module 10b continues.

On the other hand, if the determination is negative in step S302, the processing proceeds to step S304.

In step S304, an alert is issued when the monitor current Im exceeds the monitor current alert value Imalt. For example, the user is requested to replace the optical module 10b (the user is notified of the service life of the optical module 10b), and the driving control processing according to the present exemplary embodiment ends. It should be noted that the constant current driving is continued even after the replacement of the optical module 10b is requested. Therefore, the light emission from the optical module 10b is maintained.

[Third Exemplary Embodiment]

An optical transmission device 200 according to this exemplary embodiment will be described with reference to FIGS. 9A and 9B and FIGS. 10A and 10B. The optical transmission device 200 is a device that constitutes an optical transmitter of a communication apparatus which performs mutual optical communication via an optical fiber. The optical transmission device 200 is equipped with the optical module (the optical module 10, 10a or 10b) according to any of the above-described exemplary embodiments. In the present exemplary embodiment, hereinafter, a mode in which the optical module 10 is mounted will be described as an example.

Figure 9A:
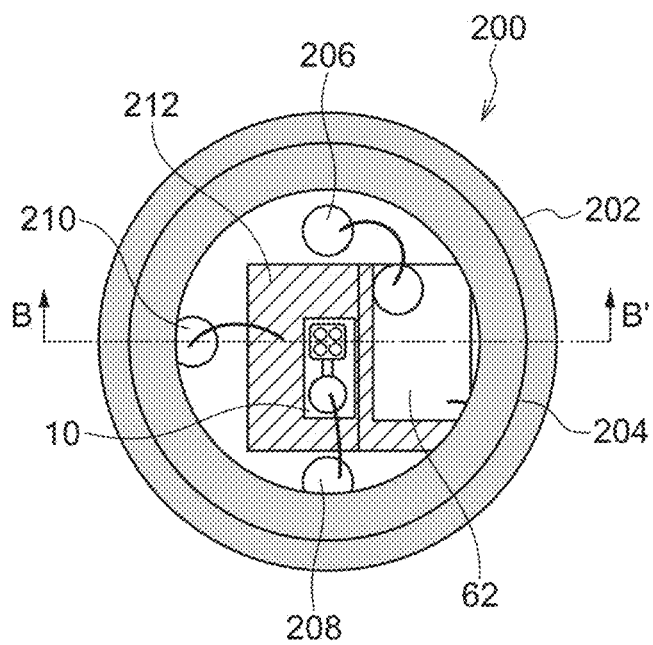
FIG. 9A is a plan view illustrating an example of the configuration of an optical transmission device according to a third exemplary embodiment.
Figure 9B:
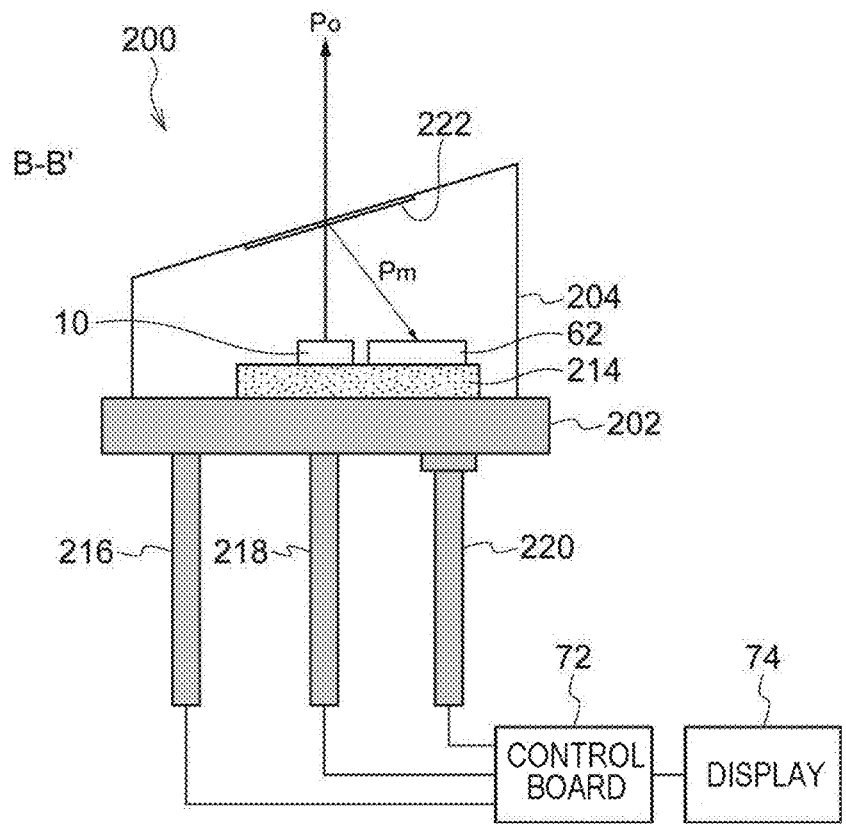
FIG. 9B is a cross-sectional view illustrating the optical transmission device.

FIGS. 9A and 9B are a plan view and a cross-sectional view of the optical transmission device 200, respectively. As illustrated in FIGS. 9A and 9B, the optical transmission device 200 includes the optical module 10, a monitor PD 62, a sub-mount 214, and a package on which these components are mounted. The package of the optical transmission device 200 includes a stem 202, a cap 204, a cathode terminal 216, anode terminals 218 and 219 (in FIG. 9B, the anode terminal 219 is invisible because it is hidden behind the anode terminal 218), and a cathode terminal 220.

The sub-mount 214 is a substrate on which, for example, the optical module 10 and the monitor PD 62 are mounted. The sub-mount 214 is configured with, for example, a semiconductor substrate. In addition, an n-side wiring 212 made of a metal film or the like is formed on the surface side of the sub-mount 214 on which the optical module 10 or the like is mounted. The n-side electrode wiring 30 of the optical module 10 is connected thereto.

The stem 202 is a metal base on which the sub-mount 214 is mounted. The stem 202 holds the cathode terminal 216, the anode terminals 218 and 219, and the cathode terminal 220. The cathode terminal 216 and the anode terminals 218 and 219 are held on the stem via a required insulator. The cathode terminal 220 is directly brazed to (has the same potential as) the stem 202.

As illustrated in FIG. 9A, the p-side electrode pad 28 of the optical module 10 is connected to an anode electrode 208 by a bonding wire and is connected to the outside (for example, a drive power supply) via the anode terminal 218. Meanwhile, the n-side electrode wiring 30 of the optical module 10 is connected to a cathode electrode 210 via the n-side wiring 212 and a bonding wire, and is connected to the outside (for example, the drive power supply) via the cathode terminal 216.

The anode of the monitor PD 62 is connected to an anode electrode 206 via a bonding wire, and is connected to the outside (for example, the drive power supply) via the anode terminal 219. Meanwhile, the cathode of the monitor PD 62 is connected to the stem 202 by a bonding wire and is connected to the outside (for example, the drive power supply) via the cathode terminal 220.

The cap 204 seals a semiconductor element or the like mounted on the sub-mount 214 in an airtight manner. The cap 204 of the present exemplary embodiment is formed of a metal. An opening is formed in the cap 204 to allow the optical output Po from the optical module 10 to pass therethrough. A partial reflection mirror 222 is attached to the opening. Most of the optical output Po passes through the partial reflection mirror 222 and is output to the outside (an optical fiber which will be described later in the present exemplary embodiment). However, a part of the light (about 10% as an example) is reflected by the partial reflection mirror 222 and is incident on the monitor PD 62 as monitor light Pro. The monitor light Pm generates the above-described monitor current Im.

Semiconductor elements which constitute the controller 70, the APC drive unit 60, the constant-current drive unit 64, the power monitor unit 66, and the like and required passive components such as a resistor and a capacitor are mounted on a control board 72. The control board 72 is connected to the optical module 10 and the monitor PL) 62 via the cathode terminal 216 and the anode terminals 218 and 219. With this configuration, the semiconductor elements and the required passive components constitute the optical transmission device 200. In addition, the controller 70, the APC drive unit 60, and the like may be mounted on the sub-mount 214.

In addition, the optical transmission device 200 includes a display device, such as a display 74 or a warning lamp, which serves as a notification unit. The display device notifies the user that an alert is issued, based on an instruction from the controller 70. It should be noted that another element such as a voice unit may be used as long as it has a function of notifying the user.

Figure 10A:
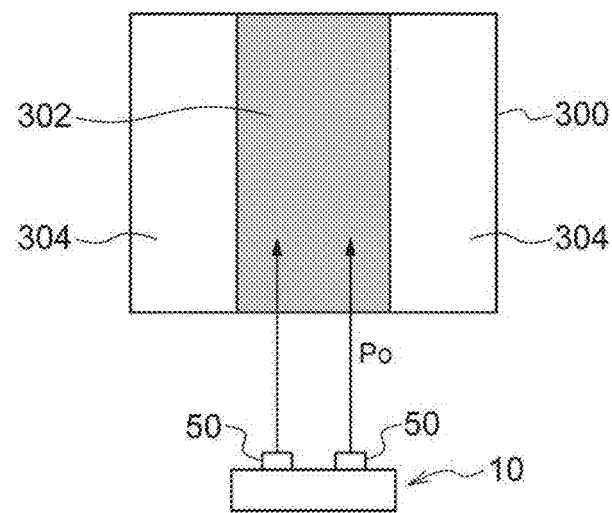
FIG. 10A is a side view illustrating a coupled state of an optical module and an optical fiber in the optical transmission device according to a third exemplary embodiment.
Figure 10B:
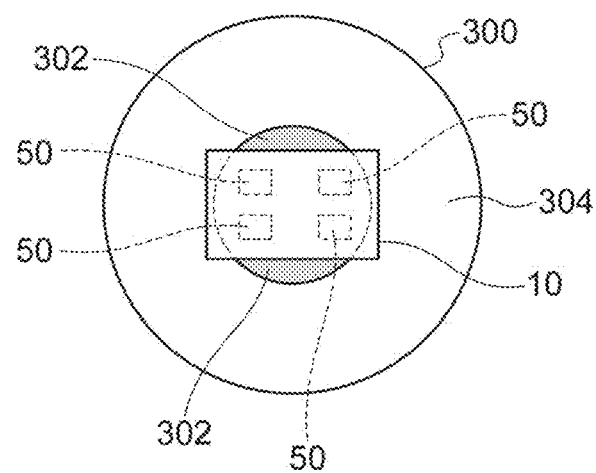
FIG. 10B is a plan view illustrating the coupled state.

Next, the coupling between the optical module 10 and an optical fiber 300 will be described with reference to FIGS. 10A and 10B. FIGS. 10A and 10B are a cross-sectional view and a plan view illustrating the coupled state of the optical module 10 and the optical fiber 300, respectively. As the optical fiber 300 according to the present exemplary embodiment, for example, a single mode fiber, a multi-mode fiber, or a plastic fiber may be used without particular limitation thereto. In the present exemplary embodiment, a multi-mode fiber is used.

As illustrated in FIG. 10A, the optical fiber 300 includes a core 302 and a clad 304. As illustrated in FIGS. 10A and 10B, the light emitting unit 50 of the optical module 10 is disposed such that the optical output Po enters the core 302 of the optical fiber 300. In the present exemplary embodiment, no lens is used for the coupling between the optical module 10 and the optical fiber 300. It should be noted that the disclosure is not limited thereto. The optical module 10 and the optical fiber 300 may be coupled to each other using a lens.

Here, the optical transmission device 200 mounted on the can-shaped package is described in the above-described exemplary embodiment by way of an example. Without being limited thereto, however, an optical transmission device may be configured to be mounted on a flat package.

In addition, the mode using the light emitting element array in which the respective light emitting units are monolithically integrated is described in the respective exemplary embodiments. Without being limited thereto, a mode using individual light emitting elements as respective light emitting units may be provided.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optical transmission device comprising:
   a first light emitting element configured to emit light at a wavelength λ;
   a second light emitting element configured to emit light at the wavelength λ, the second light emitting element being connected in parallel with the first light emitting element and being configured to have a shorter expected initial service life than the first light emitting element; and
   a detector configured to detect whether the second light emitting element is deteriorated,
   wherein the first light emitting element and the second light emitting element have current confinement structures, and
   wherein the second light emitting element has a current confinement diameter smaller than a current confinement diameter of the first light emitting element.

2. The optical transmission device according to claim 1, further comprising:
   a light receiving unit configured to receive the light emitted from the first light emitting element and the second light emitting element; and
   a drive unit configured to drive the first light emitting element and the second light emitting element based on an amount of light received by the light receiving unit so that an amount of light emitted from the first light emitting element and the second light emitting element emit is constant,
   wherein the detector is configured to, when a value of a current or a voltage output from the drive unit to the first light emitting element and the second light emitting element deviates from a predetermined range, detect that the second light emitting element is deteriorated.

3. The optical transmission device according to claim 2, wherein a number of first light emitting elements is greater than a number of second light emitting elements.

4. The optical transmission device according to claim 1, further comprising:
   a light receiving unit configured to receive the light emitted from the first light emitting element and the second light emitting element; and
   a drive unit configured to drive the first light emitting element and the second light emitting element with a constant voltage or a constant current,
   wherein the detector is configured to, when an amount of light received by the light receiving unit deviates from a predetermined range, detect that the second light emitting element is deteriorated.

5. The optical transmission device according to claim 4, wherein a number of first light emitting elements is greater than a number of second light emitting elements.

6. The optical transmission device according to claim 1, wherein a number of first light emitting elements is greater than a number of second light emitting elements.

7. The optical transmission device according to claim 1, wherein
   the first light emitting element and the second light emitting element have identical shapes,
   an insulating film is provided around each of the first light emitting element and the second light emitting element, and
   the insulating film around the first light emitting element and the insulating film around the second light emitting element are different from each other in at least one of a thickness, an area, or a shape.

8. The optical transmission device according to claim 1, further comprising:
   a third light emitting element configured to deteriorate earlier than the second light emitting element,
   wherein the detector is configured to detect whether each of the second light emitting element and the third light emitting element is deteriorated.

9. The optical transmission device according to claim 1, further comprising:
   a notification unit configured to issue a notification when the detector detects that the second light emitting element is deteriorated.

10. The optical transmission device according to claim 1, wherein the second light emitting element is manufactured to have a shorter expected service life than the first light emitting element under the same operating conditions.

11. The optical transmission device according to claim 1, wherein the first light emitting element and the second light emitting element are connected in parallel such that light from the first light emitting element and light from the second light emitting element are always emitted substantially simultaneously.

12. The optical transmission device according to claim 1, wherein the first light emitting element and the second light emitting element are connected to a same electrode pad.

13. The optical transmission device according to claim 1, wherein
an anode of the first light emitting element and an anode of the second light emitting element are connected to a first common wiring, and
wherein a cathode of the first light emitting element and a cathode of the second light emitting element are connected to a second common wiring.

14. An optical transmission device comprising:
a first light emitting element configured to emit light;
a second light emitting element configured to emit light, the second light emitting element being connected in parallel with the first light emitting element and being configured to deteriorate earlier than the first light emitting element; and
a detector configured to detect whether the second light emitting element is deteriorated,
wherein the first light emitting element and the second light emitting element have current confinement structures, and
wherein the second light emitting element has a current confinement diameter smaller than a current confinement diameter of the first light emitting element.

* * * * *